US006405348B1

United States Patent
Fallah-Tehrani et al.

(10) Patent No.: US 6,405,348 B1
(45) Date of Patent: Jun. 11, 2002

(54) DEEP SUB-MICRON STATIC TIMING ANALYSIS IN THE PRESENCE OF CROSSTALK

(75) Inventors: Peivand Fallah-Tehrani, Thousand Oaks; Shang-Woo Chyou, Westlake Village, both of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/481,750

(22) Filed: Jan. 11, 2000

Related U.S. Application Data

(60) Provisional application No. 60/161,897, filed on Oct. 27, 1999.

(51) Int. Cl.[7] .............................................. G06F 17/50

(52) U.S. Cl. .................... 716/4; 716/5; 716/6

(58) Field of Search ..................... 716/4, 5, 6

(56) References Cited

U.S. PATENT DOCUMENTS

| | | | | |
|---|---|---|---|---|
| 5,477,460 A | * | 12/1995 | Vakirtzis et al. ............ | 364/489 |
| 5,481,695 A | * | 1/1996 | Purks ........................ | 395/500 |
| 5,502,644 A | * | 3/1996 | Hamilton et al. ........... | 364/488 |
| 5,568,395 A | * | 10/1996 | Huang ....................... | 364/488 |
| 5,867,810 A | * | 2/1999 | Miura et al. ................ | 702/191 |
| 6,028,989 A | * | 2/2000 | Dansky et al. ......... | 395/500.09 |
| 6,253,355 B1 | * | 6/2001 | Chadha et al. .................. | 716/5 |
| 6,259,258 B1 | * | 7/2001 | Cook et al. .................. | 324/628 |

OTHER PUBLICATIONS

Cuviello et al, "Fault Modeling and Simulation for Crosstalk in System–on–Chip Interconnects," IEEE, Nov. 1999, pp. 297–303.*

Tang et al, "Channel Cross–Coupling in a Polymer–Based Single–Mode Bus Array," IEEE, Jan. 1995, pp. 37–41.*

Yim et al, "Reducing Cross–Coupling Among Interconnect Wires in Deep–Submicron Datapath Design," IEEE, Jun. 1999, pp. 485–490.*

Lee et al, "An Interconnect Transient Coupling Induced Noise Susceptibility for Dynamic Circuits in Deep Submicron CMOS Technology," IEEE, Jun. 1998, pp. ii–256–ii–259.*

Su et al, "Crosstalk Analysis of Multi–Section Multi–Conductor Lines," IEEE, 1992, pp. 142–146.*

You et al, "Analysis and Simulation of Multiconductor Transmission Lines for High–Speed Interconnect and Package Design," IEEE, 1990, pp. 180–184.*

Kim et al, "Transient and Crosstalk Analysis of Slighly Lossy Interconnection Lines for Wafer Scale Integration and Wafer Scale Hybrid Packaging–Weak Coupling Case," IEEE, 1988, pp. 1369–1381.*

(List continued on next page.)

Primary Examiner—Vuthe Siek
(74) Attorney, Agent, or Firm—Wagner Murabito & Hao LLP

(57) ABSTRACT

A method for static timing analysis of deep sub-micron devices in presence of crosstalk. The present invention provides an efficient platform for fast and accurate static timing verification of large scale transistor and cell level netlists, with coupled interconnects and high switching speeds. The present invention also provides a novel approach to solve the coupled noise problem in static timing verification. The present invention also provides for a method of determining worst case aggressor switching time for a cross-coupled interconnect stage. After the worst case aggressor switching time is determined, the netlist is then resimulated using the worst case aggressor switching time to determine more accuate stage delay and slew of the interconnect stage. The output waveform is recorded and utilized as the input of subsequent stages.

28 Claims, 13 Drawing Sheets

OTHER PUBLICATIONS

"Signal Delay in RC Tree Networks"; P. Penfield, Jr.; Dept. of Electrical Engineering & Computer Science Massachusetts Institute of Technology, Cambridge MA 02139; J. Rubinstein; Digital Equipment Corp. 75 Reed Rd., Hudson MA 01749; 18th Design Automation Conference 1981.

"Charge–Sharing Models for Switch–Level Simulation"; C. Chu et al.; Center for Integrated Systems, Stanford University, Stanford, CA 94305; IEEE Transactions on Computer–Aided Design, vol. CAD–6, No.6 Nov. 1987.

"Asymptotic Waveform Evaluation for Timing Analysis"; L. Pillage et al.; IEEE Transactions on Computer–Aided Design, vol. 9, No. 4, Apr. 1990.

"A New Nonlinear Driver Model for Interconnect Analysis"; V. Raghavan et al.; Dept. of Electrical Engineering & Computer Science Carnegie Mellon University, Pittsburgh, PA 15213; 28th ACM.IEEE Design Automation Conference 1991.

"A New CMOS Driver Model for Transient Analysis & Power Dissipation Analysis"; Liao et al.; International Journal of High Speed Electronic & Systems, vol. 7, No. 2, 1996.

"Methods to Improve Digital MOS Macromodel Accuracy"; Kong et al.; IEEE Transactions on Computer–Aided Design of Integrated Circuits & Systems, vol. 14, No. 7, Jul. 1995.

"Calculating Worst–Case Gate Delays Due to Dominant Capacitance Coupling"; Dartu et al.; Depart. of ECE, Pittsburgh, PA 15213; 1997.

"Determination of Worst–Case Aggressor Alignment for Delay Calculation"; Gross et al.; Dept. of Electrical Engineering & Computer Science Carnegie Mellon University, Pittsburgh, PA 15213; 28th ACM IEEE Design Automation Conference, 1998.

"Performance Computation for Precharacterized CMOS Gates with RC Loads"; Dartu et al.; IEEE Transactions on Computer–Aided Design of Integrated Circuits & Systems, vol. 15, No. 5, May 1996.

"RICE: Rapid Interconnect Circuit Evaluation Using AWE"; Ratzlaff et al.; IEEE Transactions on Computer–Aided Design of Integrated Circuits & Systems, vol. 13, No.: 6, Jun. 1994.

"RICE: Rapid Interconnect Circuit Evaluator"; Ratzlaff et al.; Dept. of Electrical Engineering & Computer Science, University of Texas, Austin TX 78712; 28th ACM IEEE Design Automation Conference, 1991.

"Extraction of Transient Behavioral Model of Digital I/O Buffers for IBIS"; Tehrani et al.; Dept. of Electrical Engineering & Computer Science University of New York at Binghampton No date.

* cited by examiner

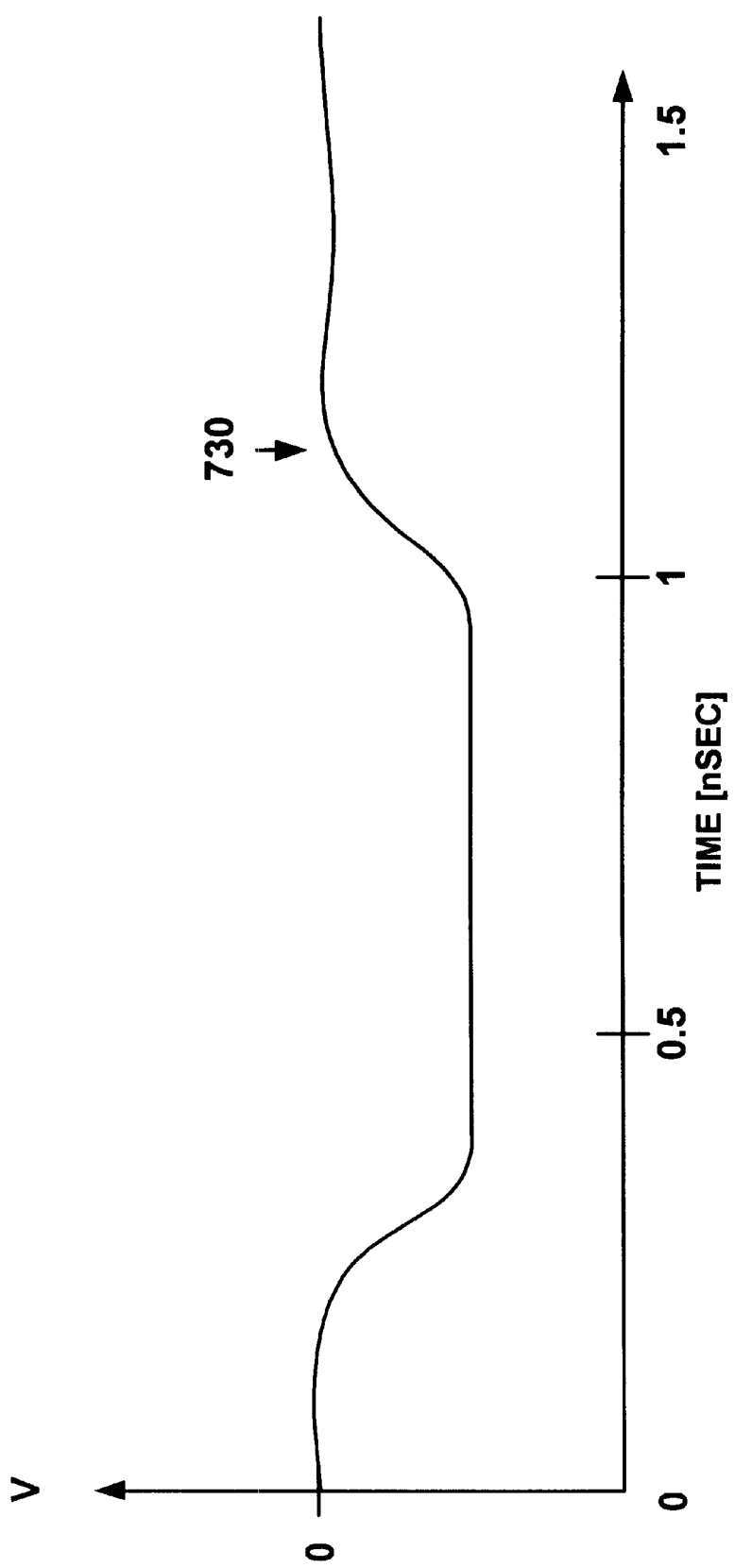

$$V_{total}(t, Ts_1, \ldots, Ts_n) = V_{main}(t) + \sum_{i=1}^{n} Vbump_i(t-Ts_i) \quad \text{910}$$

$$\min/\max \; V_{total}(t_x, Ts_1, \ldots, Ts_n) = x \cdot V_{DD} \quad \text{920}$$

$$Ts_i \in [Tmin_i, Tmax_i]$$

WITH ASSUMPTIONS:

$n$ = number of aggressor inputs.
$V_{DD}$ = Total rail to rail voltage swing.
$x$ = Percentage of total swing. (Normally 50 for delay calculations).
$t_x$ = The time in which the response is $x$ percent of its total swing.
$Vmain$ = Output response with only primary input switching.
$Vbump_i$ = Output response with only aggressor input $i$ switching.

FIG. 9

DEEP SUB-MICRON STATIC TIMING ANALYSIS IN THE PRESENCE OF CROSSTALK

RELATED CASE

The instant application claims the priority of U.S. Provisional Patent Application Serial No. (60/161,897), filed on Oct. 27, 1999, and entitled "DEEP SUB-MICRON STATIC TIMING ANALYSIS IN PRESENCE OF CROSSTALK," by Fallah-Tehrani et al., and assigned to the assignee of the present invention.

FIELD OF THE INVENTION

The present invention pertains generally to the field of computer-aided design of integrated circuits. More particularly, the present invention relates to techniques and methods for static timing analysis of integrated circuit devices in the presence of crosstalk.

BACKGROUND OF THE INVENTION

Faster clock frequency, smaller device geometry, larger chip size and the demand of low power consumption have made timing and signal integrity related issues increasingly critical in VLSI (Very Large Scale Integrated) circuits. As manufacturing processes and design technology make progress to create faster and larger integrated circuits, these problems become worse. Thus, a good and effective methodology is needed to help designers address these issues.

With finer feature sizes and higher signal speeds, interconnect has become the ultimate determinant of system performance. It has become necessary to consider the effects of the interconnect on transient signal propagation. One solution for this problem is to use a circuit simulator such as SPICE to accurately identify systems timing violations and the critical nets associated with them. Although SPICE is the de facto solution of the chip timing verification, it may be too slow for large scale chip simulations. Another obstacle in using SPICE is the necessity of test vectors which could be very hard to find and ultimately some of the paths might not be verifiable through these test vectors. Because of these problems, static timing analysis has been proposed as an alternative to solve the device timing verification problem. In static timing analysis, the worst case timing of all possible paths between different inputs and outputs are carefully checked and verified versus preset criteria.

Static timing analysis is a path-centric methodology. This means that only accurate details for the path under investigation is attainable and the information available for adjacent paths are minimal. As long as the neighboring paths do not have a significant effect on the path under investigation different methods can be used to estimate the effects of the device interconnects. Static timing analysis can generally be categorized into cell level and transistor level techniques. Transistor level static timing analysis is used for timing evaluation of custom circuit designs. Once the circuit has been characterized, the obtained timing information can be passed to upper design level (cell level). The timing information from transistor level verification can be used in the cell level design to check the whole timing budget of the circuit. In special cases, a combination of transistor and cell level timing verification might be necessary.

Generally, the delay through an interconnect net serves as a rough estimate of its effect on the circuit performance. When the interconnect can be modeled as a resistance/capacitance (RC) tree network, its delay can be estimated by a form of the Elmore delay. The Elmore delay is an estimate of the delay for linear monotonic circuit step responses. Because the Elmore delay may only be a rough approximation of the actual delay, it may be necessary to augment it with bounds on the transient response. Unfortunately, the efforts entailed to provide these bounds often outweigh their benefits. Even when the bounds are considered, the results obtained can be indefinite. Another technique attempts to force a two pole approximation on RC tree structures in order to estimate the interconnect delay.

Yet another technique is to obtain RC delay using asymptotic waveform evalutaion (AWE) methods by which a transistor is modeled as an overly simplistic linear resistor or a T-model or a $\pi$-RC network. The RC delay obtained using AWE methods may therefore be insufficiently accurate for some applications. More accurate models based on inverter analysis techniques have also been proposed. An example of such a model is an independent current source model of a nonlinear driver where the effects of distributed interconnect loads are modeled with summation of exponential functions. That model separates the output response into four different regions. Because that model uses a linearly increasing current source to model the output current, the results obtained from this method may deviate from real results significantly. That model also fails to take into account the CMOS transient leakage (short-circuit) current, so it cannot be used for system power calculations.

Another model tries to correct those problems by using a five region linear-quadratic-exponential piece-wise linear model for the driver. An eight region model has also been proposed for describing different cell outputs. Those models, however, also suffer from several limitations. The derivations for these models are based on quadratic transistor equations, such as SPICE level one and two transistor models and pure capacitive loading. Then these models are generalized to other type of loading, such as RC interconnects. The generalization degrades the accuracy of these techniques, especially, if more than a single driver is present on the net to be analyzed. These models can produce good results for primitive MOS structures, but when the cell contains series connected transistors, again the accuracy achieved by these modeling techniques would not be adequate.

Further, the above methods have limited applicability due to restriction on circuit topology. With the increasing speed of MOS circuits, the effects of coupling capacitances significantly affects the delay estimate, rendering the RC tree model inadequate. Interconnect models often have meshes of resistance which are not handled by the RC tree method. Finally, the RC tree model can not handle non-equilibrium initial conditions which are required to accommodate precharge and charge sharing effects.

Along with the increasing importance of interconnects in transient analysis, nonlinear active devices in a system contribute to the system behavior significantly. The modeling methods discussed above have a over-simplistic implementation of non-linear devices. They do not model the effects of distributed loading accurately enough for transistor level deep sub-micron timing analysis.

The definition of delay is further complicated in the presence of crosstalk. Normally, delay is measured as the time difference between the input and output voltages passing a certain threshold voltage (e.g., delay threshold voltage). In most cases, the threshold voltage is set to 50 percent of rail to rail voltage. Slew is typically defined as the time difference for a voltage signal to pass two preset voltage levels (e.g. 10%–90% or 20%–80% of rail to rail voltage). These definitions are straight forward as long as the signal has a smooth rail to rail transition.

In presence of cross coupling from neighboring nets, the task of defining the delay and slew of a circuit becomes more complex. In some cases, the amount of coupled noise from neighboring nets could be so big that it may cause the gate to switch at an incorrect time. The incorrect switching may lead to a functional failure for the circuit. Further, glitches created in this fashion cause extra power consumption in the circuit. Another mechanism by which crosstalk can affect a circuit is delay variations on a signal line. In some cases, crosstalk may change the timing of a path. This leads to timing violations in subsequent circuits connected to the cross-coupled circuit. All of these problems are quite complex and very difficult to address.

Accordingly, what is needed is a computer-aided electronics design automation (EDA) tool that is capable of quickly and accurately simulating the timing characteristics of very large transistor and cell-level netlists in deep submicron devices. What is also needed is a novel timing verification methodology and tool for performing static timing analysis of deep sub-micron devices in the presence of crosstalk.

SUMMARY OF THE DISCLOSURE

Accordingly, the present invention provides a method and analysis tool for determining crosstalk effects in transistor and cell level timing. The present invention provides an efficient platform for fast and accurate static timing verification of large scale transistor-level and/or cell level netlists, with coupled interconnects and high switching speeds. The present invention also provides a novel approach to solving the coupled noise problem in static timing verification.

In furtherance of one embodiment of the present invention, a circuit netlist is accessed and the channel connected regions are determined. In addition, primary (victim) net and aggressor nets of a cross-coupled interconnect stage of the netlist are identified. Thereafter, static timing analysis steps are performed to determine the aggressor nets' switching windows. Significantly, according to one embodiment of the invention, worst case aggressor switching times are determined. After the determination of the worst case aggressor switching times, the interconnect stage is resimulated using the worst case aggressor switching times to determine the stage delay and the slew of the primary net. The aggressor switching windows are also updated. Furthermore, according to one embodiment, the output waveform of the primary net is recorded and utilized as the input of subsequent stage(s).

According to one embodiment of the present invention, worst case aggressor switching times are determined using a bump envelope super-positioning technique. Particularly, in one embodiment, the output response of the primary net is first determined. Bump-like voltage fluctuations on the output of the primary net caused by the switching of the input of the aggressor nets are also determined. Then, a bump envelope is created for each aggressor by stretching the bump-like waveform for the duration of the aggressor timing window. Thereafter, the main output response and all bump envelopes are added together to generate a composite waveform. The delay threshold voltage crossing point of the composite waveform is then determined. The delay threshold voltage crossing point corresponds to the delay of the composite waveform. The delay threshold crossing point also matches to the peak of each bump-like waveform that causes the maximum/minimum delay of the stage. The time needed for a bump waveform to reach the maximum/minimum voltage point is then subtracted from the composite waveform delay value to generate the worst case aggressor switching time for the corresponding aggressor.

In one embodiment of the present invention, the timing of the interconnect stage is resimulated with the worst case aggressor nets switching times to account for circuit nonlinearity and to generate the worst case stage delay, output slew and output waveform of the stage. The output waveform is also propagated for use as inputs in simulating of subsequent stages.

Embodiments of the present invention include the above and further include a computer-readable medium having contained therein computer-readable codes for causing a computer-implemented electronic design automation (EDA) system to perform static timing analysis in the presence of crosstalk on an integrated circuit design represented as a netlist. Significantly, the static analysis process includes a bump envelope method for determining the worst case aggressor switching time. Particularly, the bump envelope method includes the steps of: (a) generating a primary waveform for a primary net of an cross-coupled circuit of the integrated circuit design; (b) generating a bump-envelope waveform for each aggressor net of the cross-coupled circuit; (c) generating an accumulative bump-envelope waveform by super-positioning all the bump-envelope waveforms (d) super-positioning the primary waveform over the accumulative bump-envelope waveform to generate a composite waveform; (e) determining a threshold voltage crossing point of the composite waveform; and (f) determining worst case aggressor switching times based on the threshold voltage crossing point.

BRIEF DESCRIPTION OF THE DRAWINGS

The accompanying drawings, which are incorporated in and form a part of this specification, illustrate embodiments of the present invention and, together with the description, serve to explain the principles of the invention.

FIG. 7B illustrates a bump-envelope waveform generated at various steps of the bump-envelope super-positioning method of FIG. 6 in accordance with one embodiment of the invention.

FIG. 9 illustrates the mathematical equations that can be used to describe the problem of determining the worst case switching time of the aggressors in furtherance with the present invention.

DETAILED DESCRIPTION OF THE PREFERRED EMBODIMENTS

Figure 1:
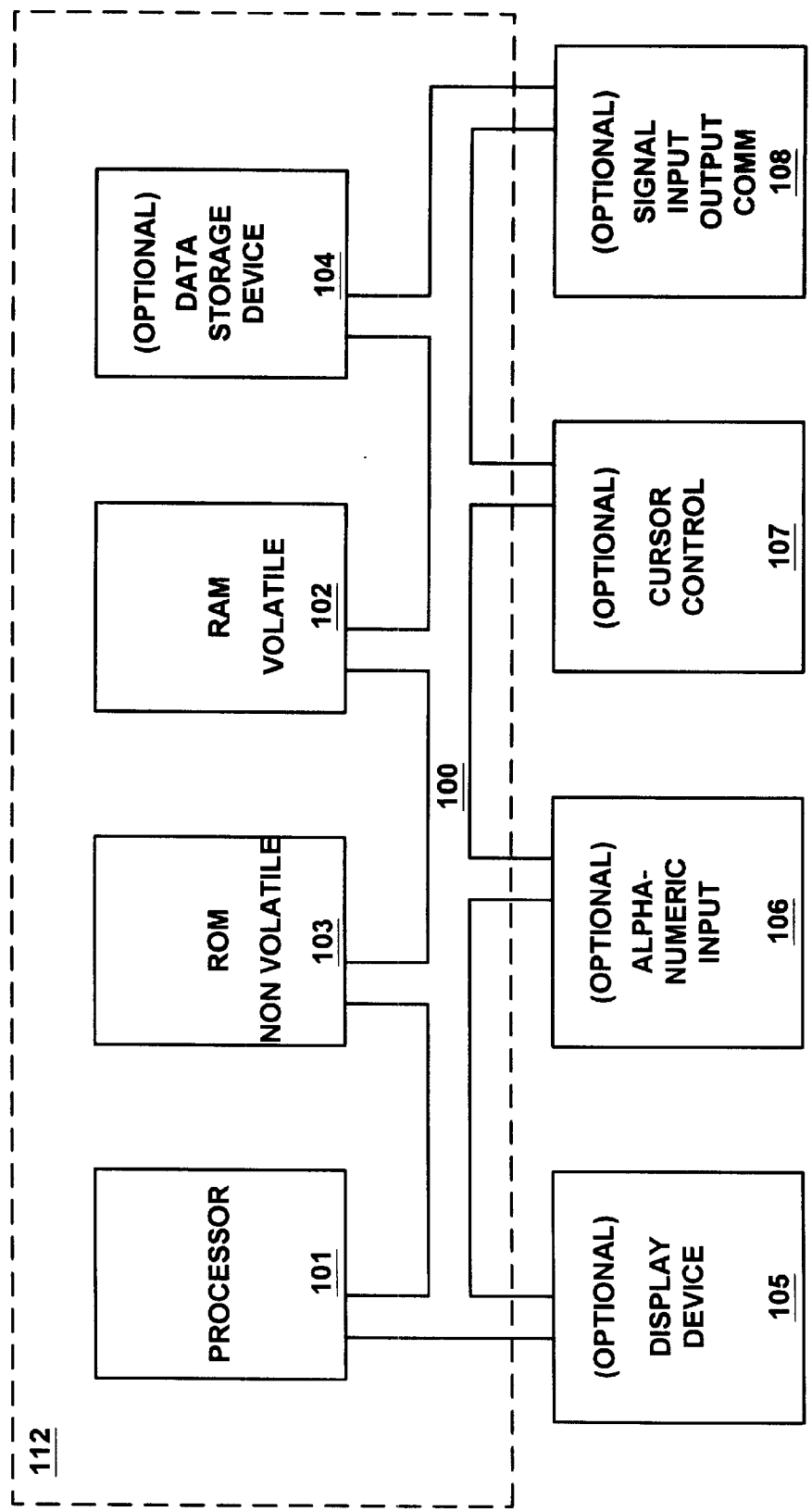
FIG. 1 illustrates a computer system operable as a platform on which embodiments of the present invention may be implemented.

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

I. Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

Aspects of the present invention, method and system for deep sub-micron static timing analysis in the presence of crosstalk, are discussed in terms of steps executed on a computer controlled electronic design automation (EDA) system. These steps (e.g., process 300) are implemented as program code stored in computer readable memory units of a computer system and are executed by the processor of the computer system. Although a variety of different computer systems can be used with the present invention, an exemplary general purpose computer system 112 is shown in FIG. 1.

II. Computer System Environment

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. It is appreciated that data produced at the various logic synthesis stages of the present invention, including representations of the different levels of abstraction of the integrated circuit design, such as a netlist, can also be stored in RAM 102, ROM 103 or the storage device 104.

Also included in computer system 112 of FIG. 1 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

III. Effects of Crosstalk on Device Timing

A discussion of the effects of cross coupling on device timing is presented. In digital circuits, delay and slew are measured on inputs and outputs of logical gates. Fortunately, logical gates can be divided into channel connected components (CCC) which are sets of transistors connected through their sources and drains. An analog voltage transition on an input of a CCC (generally a MOS gate node) causes a voltage transition of an output.

Figure 2:
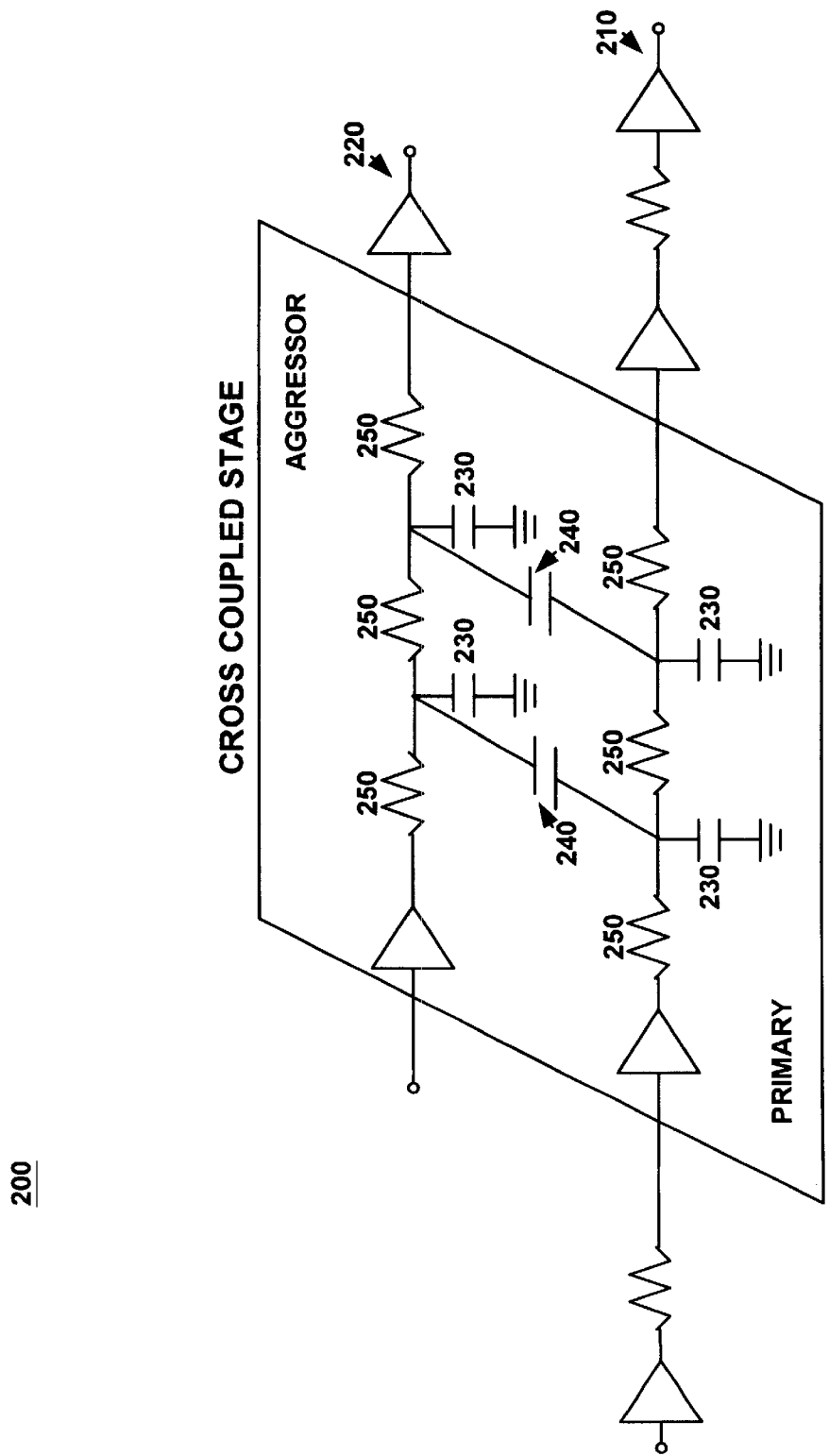
FIG. 2 is a circuit representation of an interconnect stage on which embodiments of the present invention may be practiced.

Typically, circuit extraction tools model on-chip interconnects as a RC (resistor/capacitor) circuit. An RC circuit model of an interconnect stage 200 is illustrated in FIG. 2. As illustrated, the interconnect stage 200 is modeled as a cross-coupled circuit that includes a primary net 210 and an aggressor net 220. The coupling of primary net 210 and aggressor net 220 to ground is modeled with capacitors 230. The capacitors 230 are sometimes called self capacitances. The coupling between the primary net 210 and aggressor net 220 is also modeled with capacitors 240 between these lines.

Capacitors 240 are addressed as coupling capacitances. The wire resistance of paths 210 and 220 is also represented with resistors 250.

As long as the feature sizes are not in sub-micron region, the capacitance of self capacitors 230 is much larger than that of the coupling capacitors 240. Therefore, neglecting the coupling capacitors 240 would not cause a large error in timing analysis of the primary net 210. As integrated circuits enter the sub-micron era, however, the ratio of coupling capacitance to self capacitance increases. In some cases, the coupling capacitance might even be larger than the self capacitance. This causes the switching activities of aggressor net 220 to be coupled to the primary net 210, which in turn may affect the timing of the primary net 210. The amount of this coupling is directly related to: (1) the values and the locations of the coupling capacitors 240; (2) the resistor shielding of aggressor net 220 and primary net 210; and (3) the drive-ability and switching windows of aggressor net 220 and primary net 210.

Figure 4:
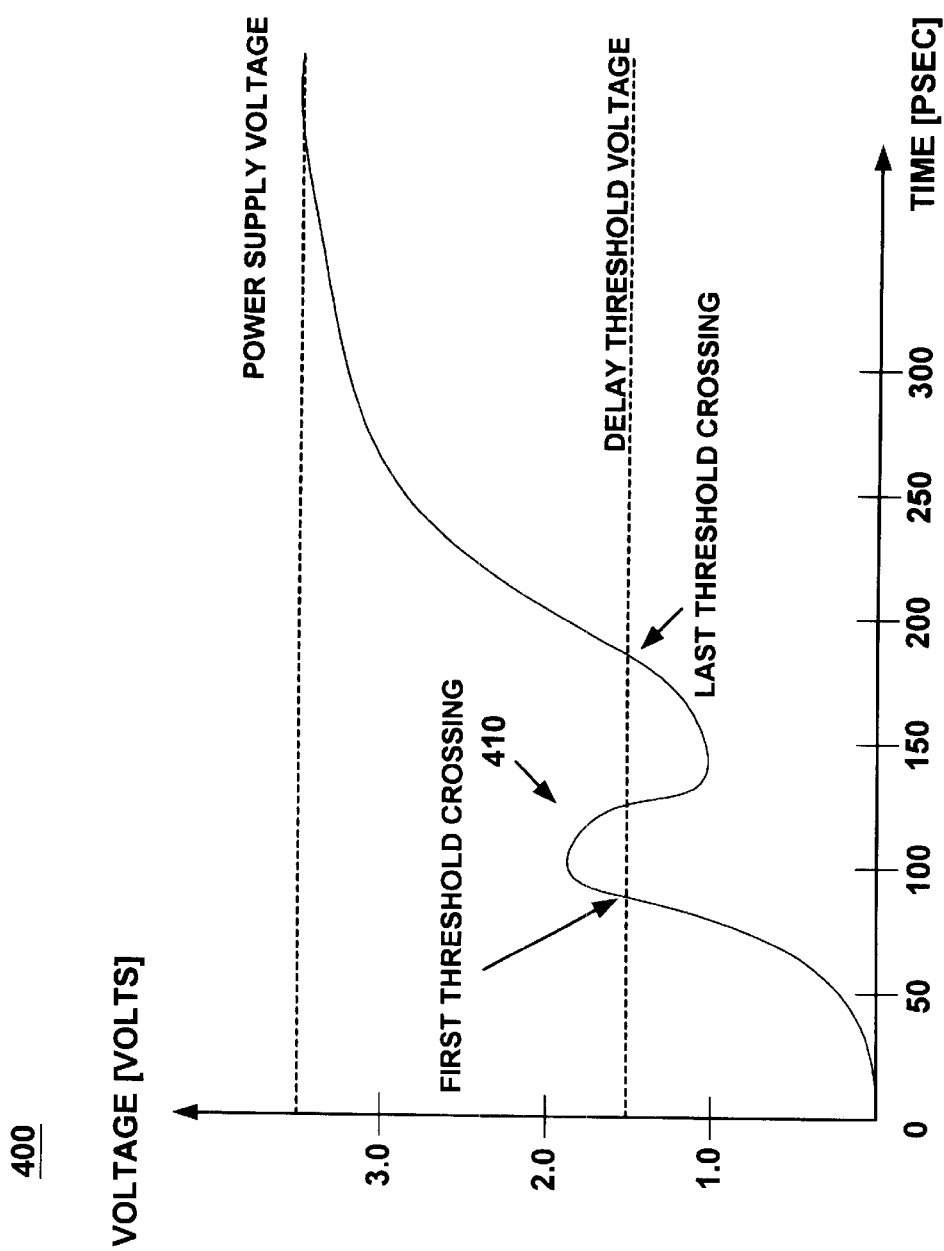
FIG. 4 is a voltage response diagram of an interconnect stage where switching of aggressor nets causes bump-like voltage fluctuations at the output of a primary net.

When aggressor net 220 switches, because of the differentiating nature of coupling capacitance, a bump-like voltage fluctuation is created on the primary net 210. An exemplary bump-like voltage fluctuation 410 is illustrated in FIG. 4. A more complicated bump-like fluctuation would be created if many aggressors are present. If this bump's peak voltage is large and the output switching windows of primary net 210 and aggressor net 220 overlap, then the primary stage delay could be affected to a large extent. In addition, as illustrated in FIG. 4, the bump-like voltage fluctuation 410 passes the delay threshold voltage 420 multiple times. Further, depending on the aggressor's switching direction, the delay of the primary stage might increase or decrease. Accordingly, the present invention provides an efficient method of static timing analysis that takes into consideration crosstalk effects.

IV. Static Timing Analysis in the Presence of Crosstalk

Figure 3:
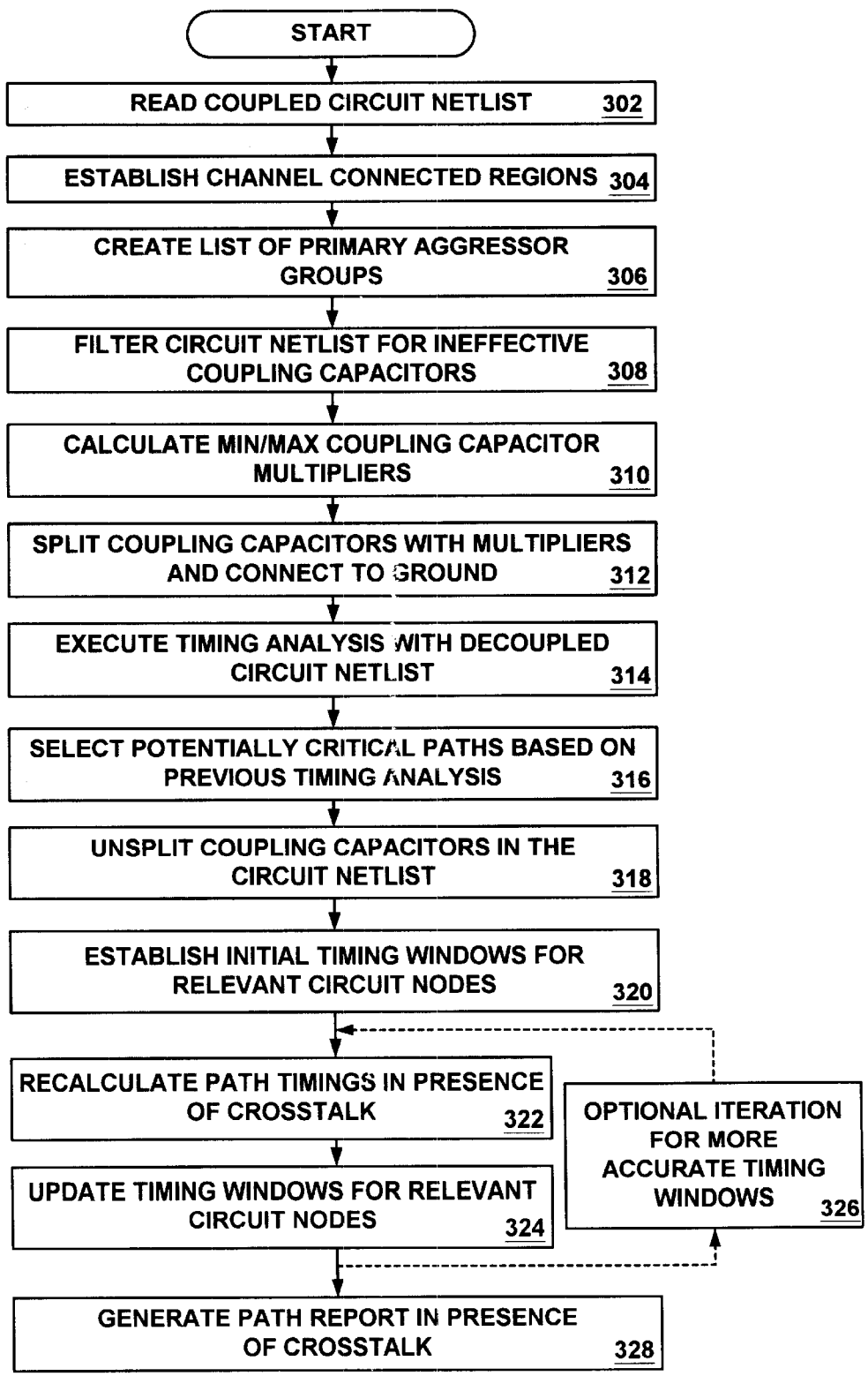
FIG. 3 is a flow diagram illustrating steps of a static timing analysis method in the presence of crosstalk in furtherance of one embodiment of the present invention.

FIG. 3 is a flow diagram 300 illustrating steps of a static timing analysis method in the presence of crosstalk in furtherance of one embodiment of the present invention.

As illustrated, at step 302, a transistor level or cell level netlist is read a static timing analysis tool of the present invention. The netlist may be in Verilog, VHDL, Epic or SPICE format. The parasitics (e.g., resistors, capacitors, inductors, and coupling capacitors, etc.) may be read into the static timing analysis tool in DSPF, SPEF or SPICE format.

At step 304, the transistor netlist is divided into channel connected regions. These channel connected regions (or, channel connected components CCCs) are transistors which are connected through their drain and source to each other, or connected to power and/or ground. In the present discussion, each channel connected region is referred to as a stage.

At step 306, a list of primary and aggressor groups is created. Particularly, nets are grouped based on their coupling capacitor connectivity. Nets are RC nodes connecting each output of a stage to the input of another stage without considering the coupling. In accordance with the present embodiment, the coupling to the internal nodes of a stage is also considered when the primary and aggressor groups are formed.

At step 308, the circuit netlist is filtered for ineffective coupling capacitors. Criteria for filtering may be specified be user. However, the static timing analysis tool may also provide default criteria such as: (1) the absolute value of summation of all coupling capacitors on a net should be larger than a user defined value; and/or (2) the ratio of summation all coupling to self capacitance of a net should be larger than a user defined value. When a net does not pass the mentioned criteria, the coupling capacitors on that net will be split and connected to ground and marked as ineffective.

At step 310, a net-by-net based minimum/maximum coupling factor is calculated for each net. These minimum/maximum coupling factors represent the minimum and maximum possible effect of coupling capacitors on delay if they were connected to ground instead of the other net. In other words, if a coupling capacitor is split and added to connected the capacitors connected to ground, the minimum/maximum effect of the capacitors on net delay can be determined by multiplying the values of the capacitors by the minimum/maximum multiplier factor. In the present embodiment, the multiplier may have a negative value as well as a positive value. For instance, when primary and aggressor nets switch in opposite directions, the default value for the multiplier is 2.0. Likewise, when outputs switch in the same direction, the default value for the multiplier is 0.0.

At step 312, the static timing analysis tool of the present embodiment splits the coupling capacitors between stages and connects them to ground.

At step 314, two different static timing analyses for the decoupled netlist are executed. In present embodiment, the first analysis is performed using maximum capacitor multipliers determined at step 310; and the second analysis is performed using minimum capacitor multipliers determined at step 310. In this way, a window of switching possibility is created for each node of the circuit. The shorter edge comes from minimum factors and the longer edge of the window comes from the maximum factor. It should be noted that different paths through a node contribute to the created window size for that node as well.

At step 316, potentially critical paths are selected based on the timing analyses performed at step 314. Based on the previous timing runs, sets of long and short paths are produced. The maximum number of these paths are defined by the user. These paths, which may potentially have setup/hold problems, are considered for more accurate crosstalk analysis below.

At step 318, the coupling capacitors that are grounded are "unsplit" are returned to their original non-split condition.

With reference still to FIG. 3, at step 320, initial timing windows for the aggressors are established. According to the present embodiment, analysis is performed on each of the paths selected at step 316. For each stage contained in the selected paths, the aggressor nets are determined based on the primary/aggressor grouping determined at step 306. Then, based on the static timing analysis performed at step 314, the initial timing windows for the aggressor nets are established. After establishing the switching window for primary and aggressor nets, a lower and upper limit for the delay of each path can be calculated.

Although the initial timing windows can produce an assessment for the timing of the paths, the assessment is very pessimistic and does not represent a good estimation of actual timing of the circuit. Thus, in order to achieve more accurate results, at step 322, the path timings are recalculated. Significantly, step 322 includes a step of calculating the worst case aggressor switching time and a step of recalculating the delay and slew of the relevant circuit nodes based on the worst case aggressor switching times. In furtherance of the present invention, the worst case aggressor switching times may be determined by estimation methods and/or accurate methods. Such methods are described in detail below.

At step 324, using these newly calculated delay and slew, the static timing analysis tool of the present embodiment updates the window information for the nodes involved.

At step 326, steps 322 and 324 may be repeated to achieve even more accurate timing solution. It should be noted that iteration step 326 is optional, and that the present invention may be practiced without iteration.

At step 328, the static timing analysis tool of the present embodiment generates a path timing report that contains the timing information of the paths in the presence of crosstalk. The path timing report may also include other crosstalk related information such as bump height and contribution for each aggressor on a victim net; number of aggressors; effectiveness of aggressors (contribution on delay and slew); values of coupling capacitors on each net; delay differences between absolute worst case (calculated by multipliers) and the crosstalk affected delay; delay differences between the case that all aggressors are quiet and the crosstalk affected delay; SPICE deck of the paths and the aggressor stages. Thereafter, the static timing analysis process ends.

V. Method of Calculating Aggressors Worst Case Switching Time

In general two different categories of methods are available to calculate the worst case aggressor switching times. These categories are: (1) estimation methods; and (2) accurate methods.

Estimation Methods

These methods are based on estimation of aggressor switching point in their predefined windows. Two estimation methods are discussed in the following.

In the first estimation method, a point is chosen in the aggressor switching window. This point might be the lower (early) edge, upper (late) edge or a weighted average between lower and upper edge (e.g. mid point) of the aggressor switching window. Based on the selected switching point, a circuit timing analysis is performed on the coupled stage to calculate the stage delay and output slew. The stage output voltage waveform is also maintained. This waveform is utilized as the input of the next stage on the desired path.

The second estimation method employs the primary and aggressor switching window information to estimate an average primary and aggressor switching delay and output slew. Employing the output delay and slope values, the delay threshold passing (switching) points of all aggressors are aligned with switching point of the primary stage. Again, based on the estimated aggressor average delay, the switching points of the aggressors can be evaluated. Then, using these switching points and fastest input slow for the aggressors, a timing analysis of the coupled stage is performed. This way the stage delay, output slew and output voltage waveform is calculated which will eventually be used for evaluation of next stages on the path.

The static timing bounds created, using these methods are smaller than simple grounding of coupling capacitors. These methods are very fast and are only dependent on the established switching windows of primary and aggressors. Although these methods are very fast, they are not accurate and could only be used as a rough estimation of coupling effects on timing.

Accurate Methods

More accurate static timing information can be obtained by performing multiple simulations of non-linear devices and finding the exact aggressors' switching point in their switching windows by a systematic searching mechanism. Multiple simulations of non-linear devices can be very time consuming. The present invention applies a pseudo superposition technique such that multiple simulations can be avoided. The level of accuracy obtained, using the superposition technique of the present invention is almost identical to rigorous searching methods. The present invention is also significantly faster than multiple simulation techniques.

For simplicity, the super-positioning technique of the present invention is discussed in conjunction with interconnect stage 200 illustrated in FIG. 2. Assuming linearity, super-positioning principle can directly be applied to stage 200. This means that the output response of primary net 210 for each input can be considered separately and the total output response is obtained by addition of these responses. It should be noted that, in the following discussion, it is assumed that the switching windows and slews of primary net 210 and aggressor net 220 are also known. Further, although only one aggressor net 220 is illustrated, it should be appreciated that the present invention is equally applicable to multiple aggressors.

According to the present embodiment, the primary net 210 and aggressor net 220 are coupled by the coupling capacitors 240. Because of this, the main portion of the output response is obtained from the switching of the primary net 210. The switching of input on aggressor net 220 creates bump-like voltage fluctuations on the output of primary net 210.

Figure 5:
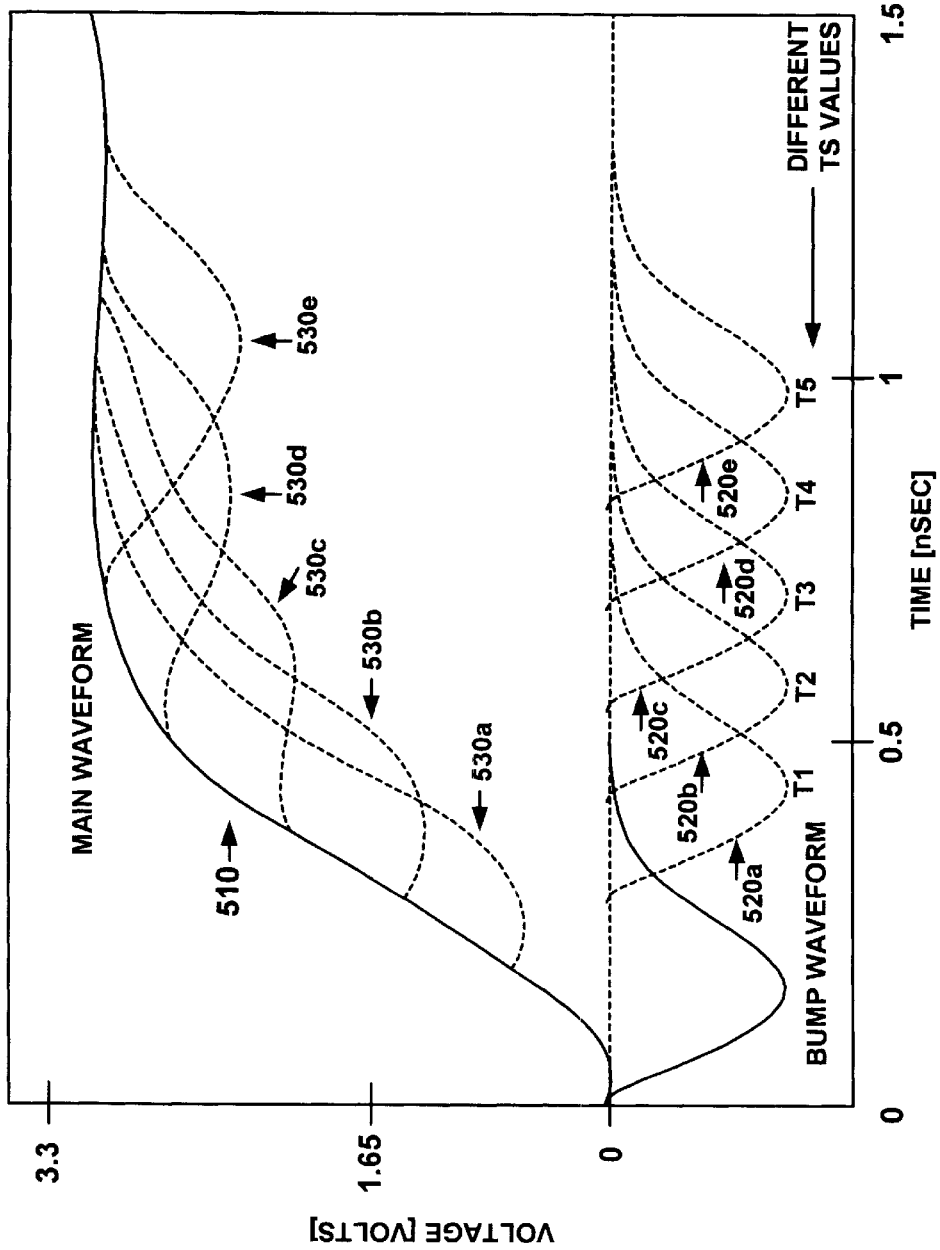
FIG. 5 illustrates different composite waveforms generated by super-positioning different bump shifts over the primary waveform in furtherance of an embodiment of the present invention.

FIG. 5 shows the output responses for the interconnect stage 200 that illustrate different coupled waveforms generated by super-positioning different bump shifts over the primary waveform. In FIG. 5, main waveform 510 is generated by applying a single switching input to primary net 510 without switching the input of the aggressor net 220. Bump waveforms 520a–520e represent the crosstalk effect and are generated by switching the input of the aggressor net 220 at various aggressor switching points T1–T5 within an aggressor switching window. Waveforms 530a–530e represent the output responses of the circuit in the presence of crosstalk and are generated by super-positioning bump waveforms 520a–520e, respectively, over main waveform 510. As shown in FIG. 5, the waveform 530b has the worst delay among the coupled waveforms 530a–530e. Composite waveform 530b is generated by super-positioning bump waveform 520b over main waveform 510.

According to the present invention, the worst case switching time of the aggressors can be determined by finding the worst location of the bump waveforms, which would produce the maximum or minimum delay on the primary output. This problem can be mathematically described by equations 910 and 920 of FIG. 9.

In the equations 910 and 920, $Ts_i$ corresponds to time shift for each bump waveform, which are unknown and have to be calculated. The difference between $Tmin_i$ and $Tmax_i$ corresponds to the switching window of the aggressor.

Generally, faster input slews cause the absolute peak voltage of aggressor bump wave responses to be larger. Further, aggressor inputs can have various switching slews in their switching window. Lower edge of the aggressor switching window usually corresponds to the fastest input slew for that aggressor, because its associated with least amount of loading. In every other point in the aggressor switching window the input slew is larger than the lower edge slew value. For these points, the peak voltage of the bump-like waveform is smaller than the one corresponding to the lower edge input slew. Smaller aggressor bump peaks in the same switching window translate to smaller coupling effects for those switching inputs. For simplicity, however, it is assumed that each aggressor switches with its fastest switching slew possible in its switching window. This may create some pessimism in calculation of cross coupling effect, but this pessimism is quite acceptable, because of the level accuracy achieved.

According to an embodiment of the present invention, the worst case switching time of aggressor net 220 can be determined by a "bump envelope" method. Steps of the "bump envelope" method 600 according to an embodiment of the invention are illustrated in FIG. 6.

Figure 6:
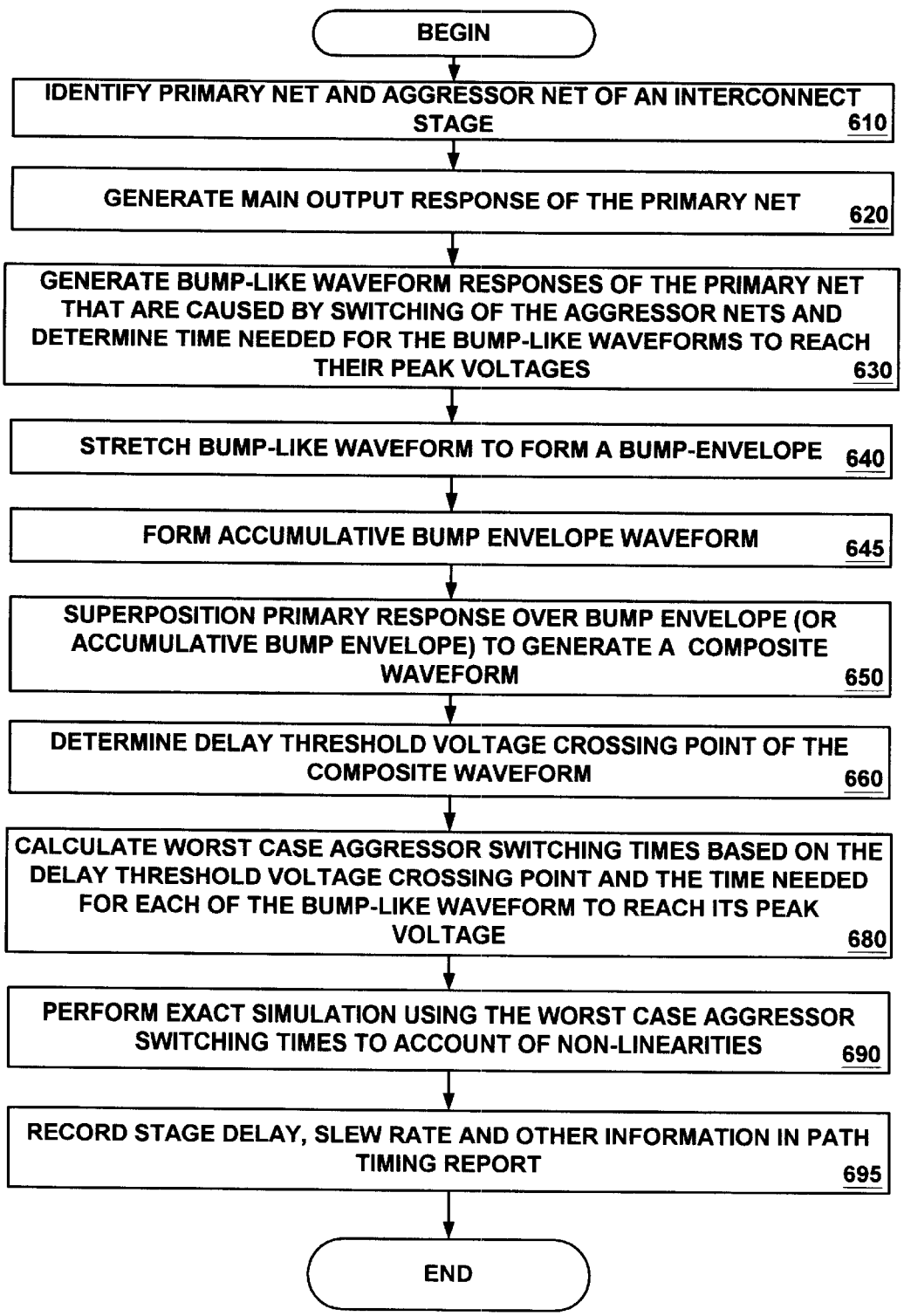
FIG. 6 is a flow diagram illustrating steps of the "bump envelope" super-positioning method in accordance with one embodiment of the present invention.

As shown in FIG. 6, at step 610, the primary net and aggressor nets of an cross-coupled circuit model of an interconnect stage (e.g., stage 200) are determined. In the present embodiment, the primary net and aggressor nets are identified based on primary/aggressor grouping information determined at other static timing analysis steps (e.g., step 306). For simplicity and for purposes of illustration,, it is assumed that the cross-coupled circuit being analysed contains only one primary net and one aggressor net in the following discussion. However, it should be noted that the present invention is equally applicable to primary nets that are associated with more than one aggressor nets.

Figure 7A:
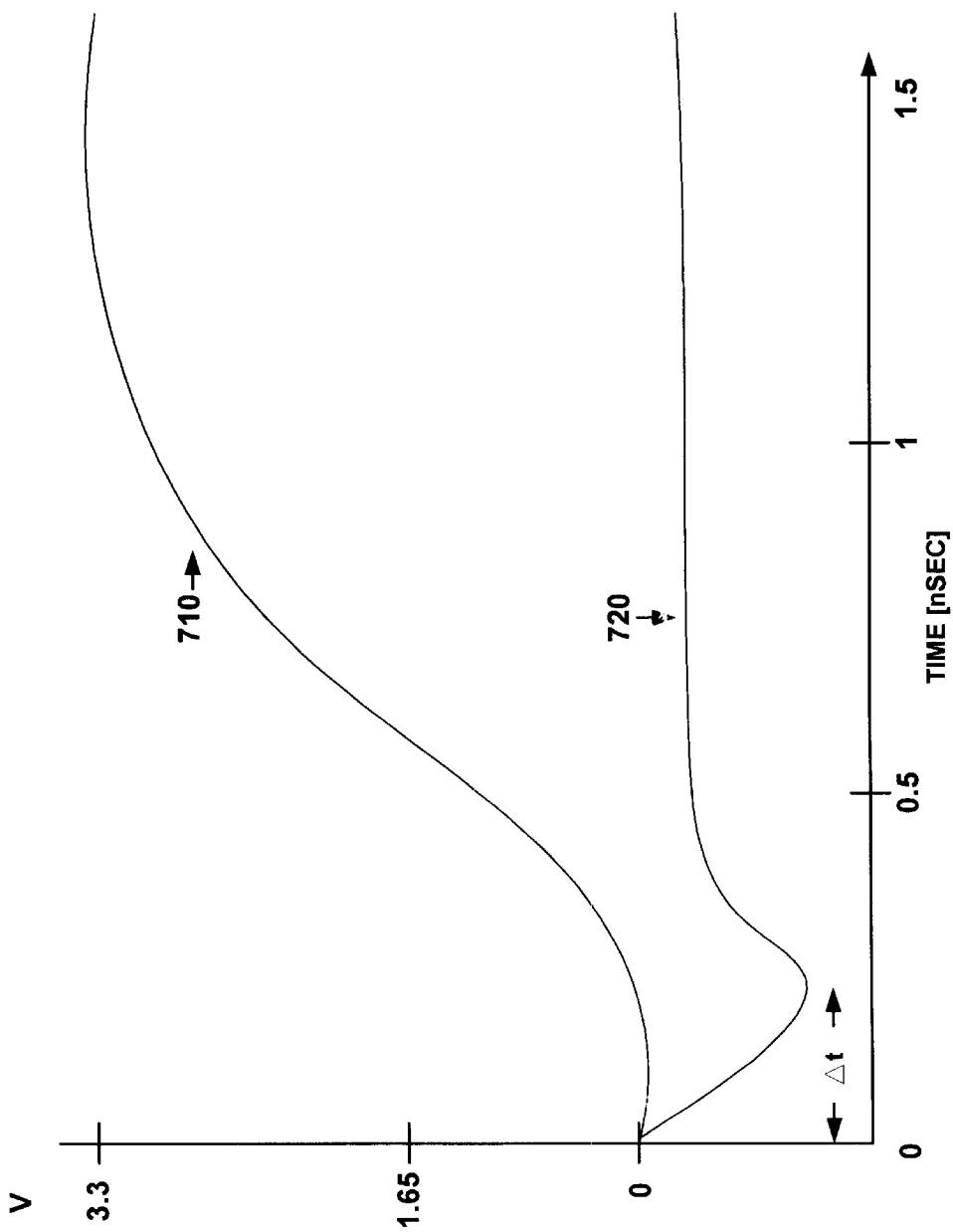
FIG. 7A illustrates a primary waveform and a bump-like waveform generated at various steps of the bump-envelope super-positioning method of FIG. 6 in accordance with one embodiment of the invention.

At step 620, a simulation step is carried out for determining the primary waveform of the output response of the cross-coupled circuit by switching the input of the primary net. An exemplary primary waveform 710 is illustrated in FIG. 7A.

At step 630, a simulation step is carried out for determining the bump-like waveform on the primary net caused by switching the input of the aggressor net. An exemplary bump-like waveform 720 is also shown in FIG. 7A. It should be noted that the exemplary bump-like waveform 720 is caused by switching the input of the aggressor net at time, t, equals zero, and that it takes Δt nanoseconds for the bump-like waveform to reach its peak.

According to the present embodiment, if the cross-coupled circuit includes multiple aggressor nets, then the inputs of the aggressors are switched one at a time to determine multiple bump-like waveforms.

Then, at step 640, a "bump envelope" waveform for each aggressor is determined. According to the present embodiment, bump envelopes are obtained by stretching the bump-like waveform (e.g., waveform 720) for the size of the switching window. An exemplary bump envelope waveform 730 is illustrated in FIG. 7B. It should be noted that in the present embodiment, the switching window is determined by other static timing analysis processes and steps (e.g., step 320 of FIG. 3).

If multiple aggressors are present in the cross-coupled circuit, then each bump-like waveform is stretched to form a bump envelope waveform. Then, at step 645, all the bump envelope waveforms are combined to form an accumulative bump envelope.

Figure 7C:
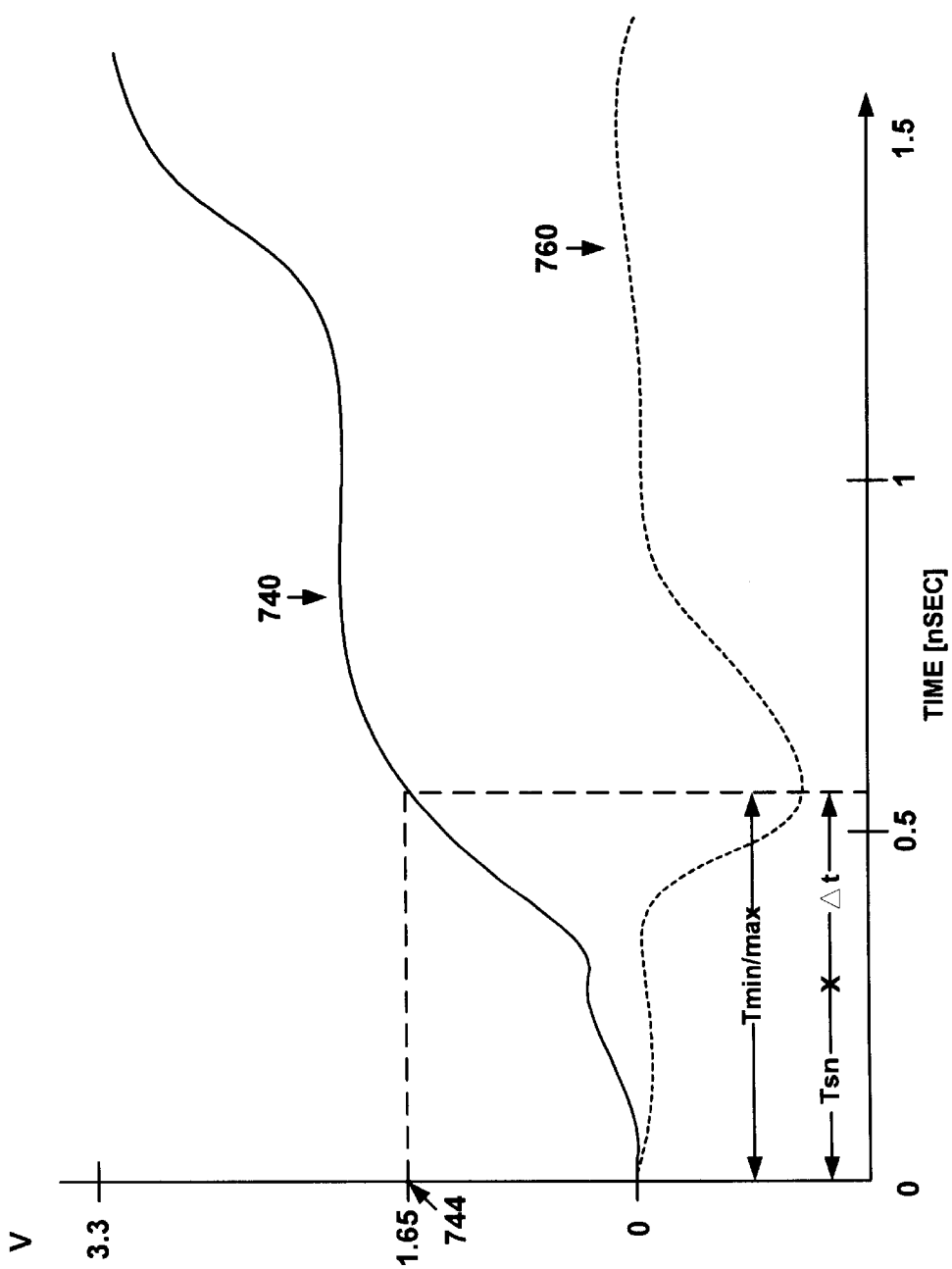
FIG. 7C illustrates a composite waveform and a shifted aggressor bump waveform generated at various steps of the bump-envelope super-positioning method of FIG. 6 according to one embodiment of the invention.

At step 650, a composite waveform is determined by super-positioning the bump envelope waveform (or the accumulative bump envelope) over the primary waveform to generate a composite waveform. An exemplary composite waveform 740 is illustrated in FIG. 7C.

Thereafter, at step 660, the delay threshold voltage crossing point of the composite waveform is determined. As illustrated in FIG. 7C, the delay threshold voltage crossing point 742 corresponds to the point where the composite waveform 740 crosses a threshold voltage 744. According to the present embodiment, this delay value equals the maximum/minimum delay, $T_{min/max}$, achievable by the cross-coupled interconnect stage, assuming linearity. It should be noted that a maximum delay is achieved when the primary net and the aggressor net are switching in opposite directions and a minimum delay is achieved when the primary net and the aggressor net are switching in the same direction.

Then, at step 680, the times needed for each aggressor response to reach its peak voltage point (e.g., Δt) are then subtracted from the minimum/maximum delay (e.g., $T_{min/max}$) to produce each aggressor's switching time. In some cases, these points might end-up outside of the aggressor's switching window. In these cases, the nearest switching point in the window will be used as its substitute. The switching time of an exemplary bump-like waveform 760 is labeled Tsw in FIG. 7C.

Figure 7D:
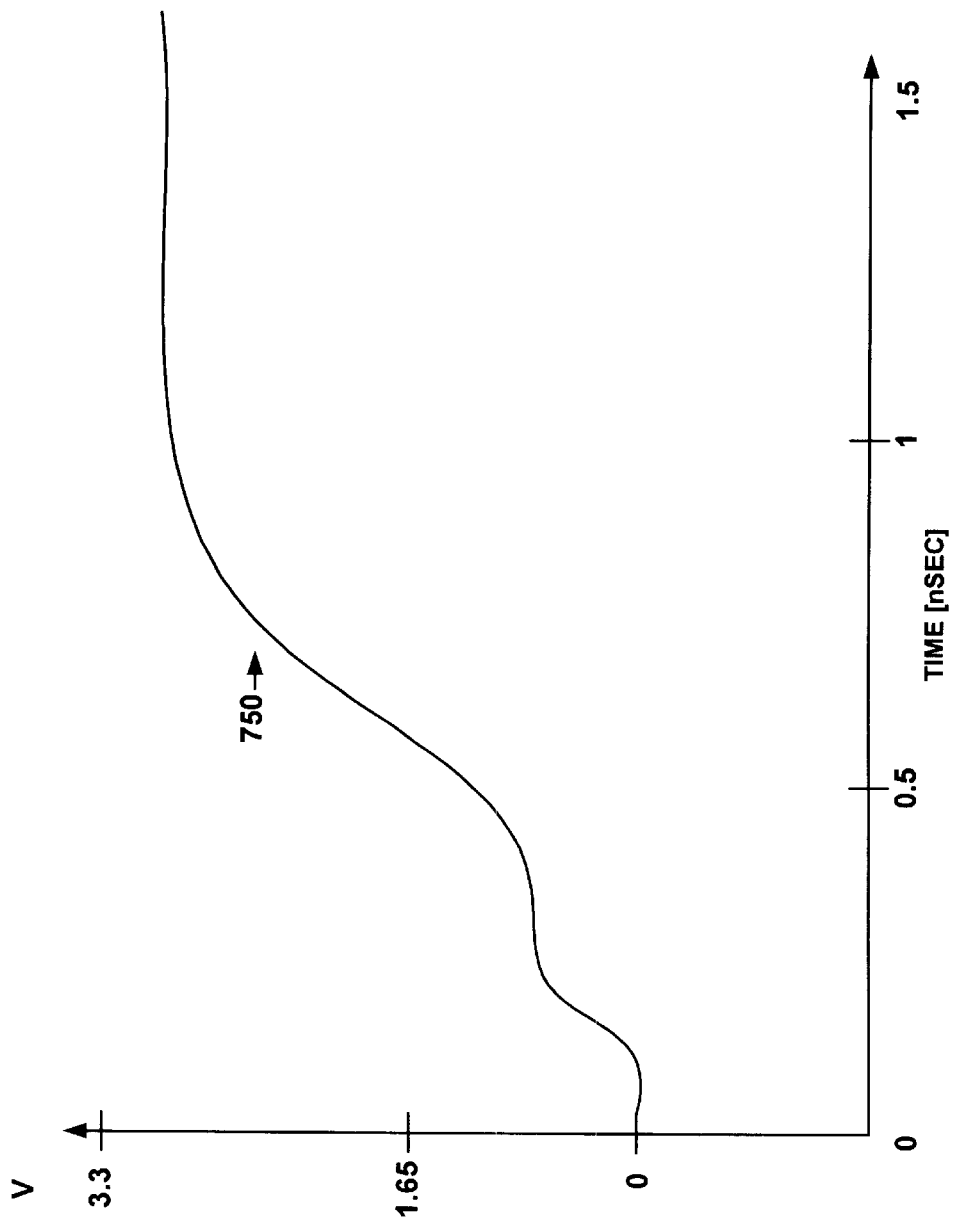
FIG. 7D illustrates a coupled output waveform generated using data obtained by accumulative the bump-envelope super-positioning method of FIG. 6 according to one embodiment of the invention.

At step 690, an exact simulation is performed using the aggressor switching times determined at step 680. The exact simulation is performed to take into account non-linearity behavior of the drivers. An exemplary output waveform 750 generated by the exact simulation step 690 is also illustrated in FIG. 7D.

At step 695, the stage delay, output slew and output waveform calculated at step 690 are recorded in a path timing report. The output waveform is propagated as the stimulus for simulation of subsequent stages. Thereafter, the process 600 ends.

According to the present embodiment, accurate results can be achieved by the bump envelope method when the output voltage of the coupled stage is monotonic. As mentioned before, delay measurement criterion could be based on the-first or last time that a output voltage waveform passes a delay threshold. In order to keep the delay measurement consistency, a single measurement method is applied for the whole circuit.

As long as the input and output voltage waveform of a stage are monotonic, for both delay measurement techniques, the optimization criterion for bump envelope method is the same. Thus, the calculated results for different delay measurement methods are identical. If input or output voltage waveforms are non-monotonic, then the bump envelope method optimization criterion for first and last threshold crossing would be different. Therefore the reported delay values would also be different. In special cases, with non-monotonic waveforms, results generated by bump envelope method slightly looses their accuracy. Table 1 below gives a description of different cases possible for bump envelope method, when non-monotonic waveforms are present.

TABLE 1

| Primary's Switching Direction | Aggressor's Switching Direction | First Delay Threshold Crossing | Last Delay Threshold Crossing |
|---|---|---|---|
| Rising | Rising | Exact | Over Estimate |
| | Falling | Under Estimate | Exact |
| Falling | Rising | Under Estimate | Exact |
| | Falling | Exact | Over Estimate |

Worst case aggressor switching time can also be determined by a "force" method. The "brute force" method uses brute force searching techniques to find the optimal switching points of the aggressors.

First step of the brute force method is to obtain the primary waveform and aggressors bump-like voltage waveforms. Then, with shifting these bumps, the maximum/minimum values of the aggressor bump-like waveforms are aligned and added together to obtain a bump composite waveform. The bump composite waveform is shifted with a delay Ts, and then it is added to primary waveform of the primary net. Then, the delay of this waveform is found by determining the threshold voltage crossing point. Same procedure is executed for different values of Ts. Using an intelligent searching technique, the worst case delay Ts is found with limited number of iterations. With Ts found, the switching point of each aggressor can then be calculated. At the end, based on these aggressor switching points, an accurate coupled stage simulation is executed to account for the non-linearity effects and the output delay, slew and voltage waveform is recorded. Finally, the next stage on the path is simulated with the recorded waveform as its input.

Prior art techniques involve using the bumps' peak values to find the maximum/minimum delay associated with the coupled system. Employing bump peaks will produce correct results only if the summation of these peaks is less than the delay threshold voltage. Another restriction of this method is that primary and aggressor output windows should be fully overlapped. This means, if an aggressor doesn't have its maximum contribution (e.g. the primary/aggressor windows have partial overlap), then the correct delay can't be found by this method. These restrictions are eliminated when bump envelope method of the present embodiment and/or brute force method are used.

Both the bump envelope method and the brute force searching method do not rely on the switching windows. However, the knowledge of the windows will decrease the amount of pessimism involved in using these methods. Bump envelope method is very fast and the brute force method is very accurate. Combination of the two methods preserve speed and accuracy together.

If a quick static timing analysis of critical paths is necessary, then estimation methods should be used. However, if high accuracy is demanded then the accurate methods should be used.

VI. Logic Relations Between Primary Net and Aggressor Nets

Figure 8A:
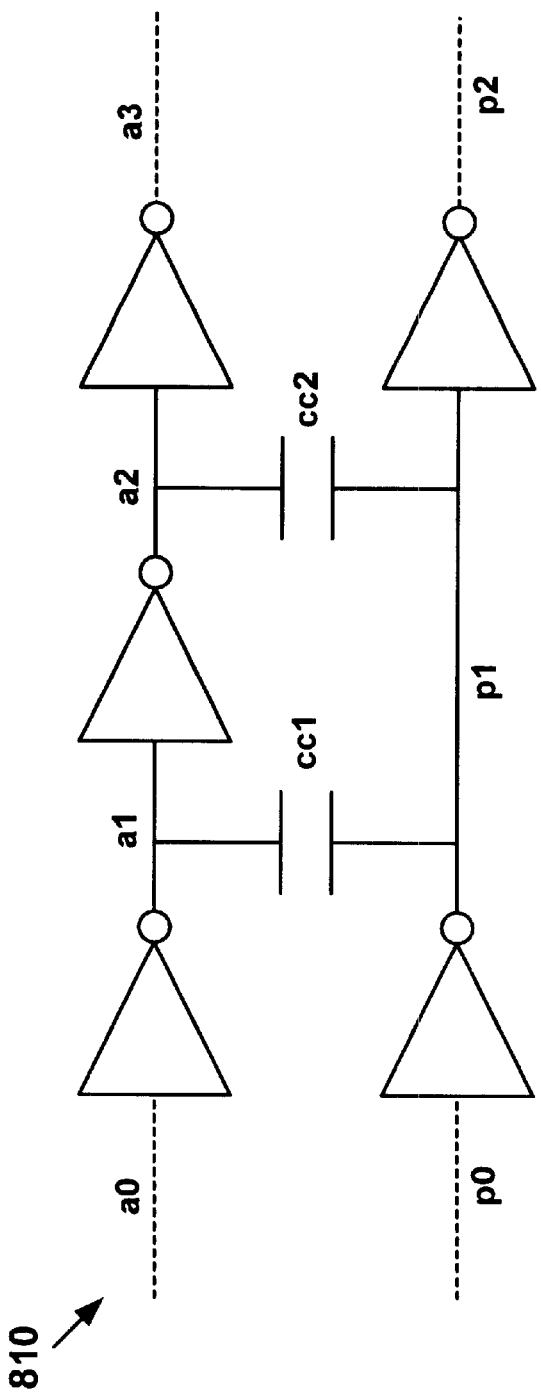
FIGS. 8A and 8B illustrate examples of different logic relations among primary and aggressor circuits.
Figure 8B:
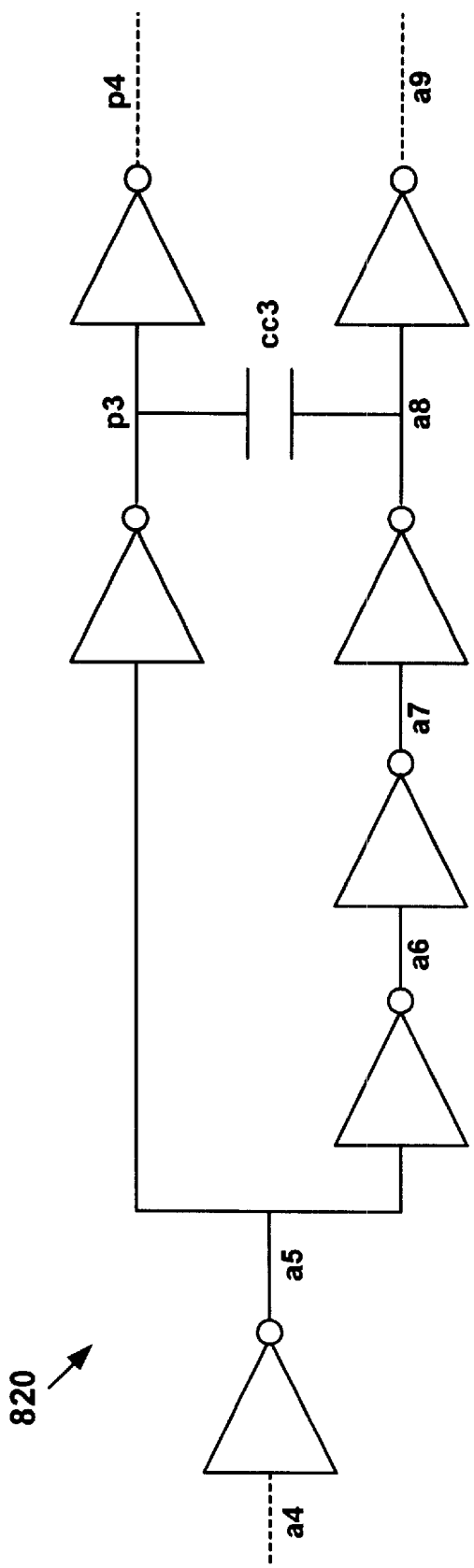

One of the most important issues, that has to be considered when using the aforementioned worst case crosstalk calculation technique is the logic relations among primary and aggressor circuits. FIGS. 8A and 8B illustrate examples of different logic relations among primary and aggressor circuits. As illustrated in FIG. 8A, which is typical case buffer insertion for long lines, nodes a1 and a2 of circuit 810 are working as aggressors for node p1. If the crosstalk calculation methodology ignores the logic relations between a1 and a2, it might generate either very pessimistic or very optimistic results.

Another example of logic relations between primary and aggressors is presented in FIG. 8B. As shown, node a8 of circuit 820 is an aggressor for node p3. Both nodes a8 and p3 have switching windows associated with them. However, as it can be seen because of convergence node a5 in the circuit, switching point of a8 can be exactly specified, within its switching window. If this fact is taken into consideration, then the amount of pessimism related to worst case aggressor switching time would be minimized.

The present invention, a methodology for static timing verification of integrated circuits in the presence of crosstalk, has thus been disclosed. The present invention allows the effects of cross coupled interconnects to be considered in deep sub-micron static timing analysis. In addition, the present invention provides methods to calculate worst case aggressor switching time. Although embodiments of the present invention are specifically described with respect to transistor-level static timing analysis, it should be noted that the present invention is equally applicable to cell-level static timing analysis. Further, while the present invention has been described in particular embodiments, it should be appreciated that the present invention should not be construed as limited by such embodiments, but should be construed according to the claims below.

What is claimed is:

1. In a computer system, a method of analysing crosstalk effects on interconnects of an integrated circuit design represented as a netlist, the method comprising the steps of:
    a) accessing a netlist and identifying a cross-coupled circuit contained therein, wherein said cross-coupled circuit includes a primary net and an aggressor net;
    b) generating a primary waveform of said cross-coupled circuit;
    c) generating a bump-envelope waveform of said cross-coupled circuit;
    d) super-positioning said primary waveform over said bump-envelope waveform to generate a composite waveform;
    e) determining a threshold voltage crossing point of said composite waveform; and
    f) determining a worst case aggressor switching time based on said threshold voltage crossing point.

2. A method as recited in claim 1 further comprising the steps of:
    generating an output waveform by re-simulating said cross-coupled circuit with said worst case aggressor switching time; and
    determining a non-linear worst case delay of said output waveform.

3. A method as recited in claim 2 further comprising the step of determining a slew of said output waveform.

4. A method as recited in claim 3 further comprising the step of generating a path timing report containing said non-linear worst case delay and said slew.

5. A method as recited in claim 1 wherein said step (b) comprises the step of switching an input of said primary net.

6. A method as recited in claim 1 wherein said step (c) comprises the steps of:
    generating a bump waveform by switching an input of said aggressor net; and
    forming said bump-envelope waveform by stretching said bump waveform along a predetermined aggressor switching window.

7. A method as recited in claim 5 wherein said step (f) comprises the steps of:
    determining a time delay required for said bump waveform to reach a peak voltage; and
    determining said worst case switching time by substracting said time delay from said threshold voltage crossing point.

8. A computer-readable medium having contained therein computer-readable codes for causing a computer-implemented electronics design automatic (EDA) to perform a method of analysing crosstalk effects on interconnects of an integrated circuit design represented as a netlist, the method comprising the steps of:
    a) accessing a netlist and identifying a cross-coupled circuit contained therein, wherein said cross-coupled circuit includes a primary net and an aggressor net;
    b) generating a primary waveform for said cross-coupled circuit;

c) generating a bump-envelope waveform of said cross-coupled circuit;

d) super-positioning said primary waveform over said bump-envelope waveform to generate a composite waveform;

e) determining a threshold voltage crossing point of said composite waveform; and f) determining a worst case aggressor switching time based on said threshold voltage crossing point.

9. A computer-readable medium as recited in claim 8 wherein said method further comprises the steps of:

generating an output waveform by re-simulating said cross-coupled circuit with said worst case aggressor switching time; and determining a non-linear worst case delay of said output waveform.

10. A computer-readable medium as recited in claim 9 wherein said method further comprises the step of determining a slew of said output waveform.

11. A computer-readable medium as recited in claim 10 wherein said method further comprises the step of generating a path timing report containing said non-linear worst case delay and said slew.

12. A computer-readable medium as recited in claim 8 wherein said step (b) of said method comprises the step of switching an input of said primary net.

13. A computer-readable medium as recited in claim 8 wherein said step (c) of said method comprises the steps of:

generating a bump waveform by switching an input of said aggressor net; and forming said bump-envelope waveform by stretching said bump waveform along a predetermined aggressor switching window.

14. A computer-readable medium as recited in claim 13 wherein said step (f) of said method further comprises the steps of:

determining a time delay required for said bump waveform to reach a peak voltage; and determining said worst case switching time by substracting said time delay from said threshold voltage crossing point.

15. A computer-implemented electronics design automation (EDA) system comprising:

means for accessing a netlist representative of an integrated circuit design;

means for identifying a cross-coupled circuit contained within said netlist, wherein said cross-coupled circuit includes a primary net and an aggressor net;

first simulation means for generating a primary waveform of said cross-coupled circuit;

second simulation means for generating a bump-envelope waveform of said cross-coupled circuit;

means for super-positioning said primary waveform over said bump-envelope waveform to generate a composite waveform;

first calculation means for determining a threshold voltage crossing point of said composite waveform; and second calculation means for determining a worst case aggressor switching time based on said threshold voltage crossing point.

16. A system as recited in claim 15 further comprising:

means for generating an output waveform by re-simulating said cross-coupled circuit with said worst case aggressor switching time; and means for determining a non-linear worst case delay of said output waveform.

17. A system as recited in claim 16 further comprising means for determining a slew of said output waveform.

18. A system as recited in claim 17 further comprising means for generating a path timing report containing said non-linear worst case delay and said slew.

19. A system as recited in claim 15 wherein said first simulation means comprises means for switching an input of said primary net.

20. A system as recited in claim 15 wherein said second simulation means comprises:

means for generating a bump waveform by switching an input of said aggressor net; and means for forming said bump-envelope waveform by stretching said bump waveform along a predetermined aggressor switching window.

21. A system as recited in claim 20 wherein said second calculation means comprises:

means for determining a time delay required for said bump waveform to reach a peak voltage; and means for determining said worst case switching time by substracting said time delay from said threshold voltage crossing point.

22. In a computer system, a method of analysing crosstalk effects on interconnects of an integrated circuit design represented as a netlist, the method comprising the steps of:

a) accessing a netlist and identifying a cross-coupled circuit contained therein, wherein said cross-coupled circuit includes a primary net and a plurality of aggressor nets;

b) generating a primary waveform of said cross-coupled circuit;

c) generating bump-envelope waveforms of said cross-coupled circuit;

d) generating an accumulative bump-envelope by super-positioning said bump-envelope waveforms;

e) super-positioning said primary waveform over said accumulative bump-envelope to generate a composite waveform;

f) determining a threshold voltage crossing point of said composite waveform; and g) determining a plurality of worst case aggressor switching times each corresponding to a respective one of said plurality of aggressor nets based on said threshold voltage crossing point.

23. A method as recited in claim 22 further comprising the steps of:

generating an output waveform by re-simulating said cross-coupled circuit with said plurality of worst case aggressor switching times; and determining a non-linear worst case delay of said output waveform.

24. A method as recited in claim 22 further comprising the step of determining a slew of said output waveform.

25. A method as recited in claim 24 further comprising the step of generating a path timing report containing said non-linear worst case delay and said slew.

26. A method as recited in claim 22 wherein said step (b) comprises the step of switching an input of said primary net.

27. A method as recited in claim 22 wherein said step (c) comprises the steps of:

generating a respective bump waveform by switching an input of one of said plurality aggressor nets; and forming one of said plurality of bump-envelope waveforms by stretching said respective bump waveform along a predetermined aggressor switching window.

28. A method as recited in claim 27 wherein said step (g) comprises the steps of:

determining a time delay required for said respective bump waveform to reach a peak voltage; and determining a respective one of said worst case switching times by substracting said time delay from said threshold voltage crossing point.

* * * * *